United States Patent [19]

Melchior

[11] Patent Number: 5,776,262

[45] Date of Patent: Jul. 7, 1998

[54] SOLAR MODULE WITH PERFORATED PLATE

[75] Inventor: Bernd Melchior, Wermelskirchen, Germany

[73] Assignee: Blue Planet AG, Schaan, Liechtenstein

[21] Appl. No.: 615,214

[22] PCT Filed: Sep. 3, 1994

[86] PCT No.: PCT/EP94/02942

§ 371 Date: Aug. 15, 1996

§ 102(e) Date: Aug. 15, 1996

[87] PCT Pub. No.: WO95/08193

PCT Pub. Date: Mar. 23, 1995

[30] Foreign Application Priority Data

Sep. 16, 1993 [DE] Germany ............... 43 31 425.2
Apr. 1, 1994 [DE] Germany ............... 44 11 458.3

[51] Int. Cl.[6] .................................................. H01L 31/048
[52] U.S. Cl. .................................. 136/251; 136/291
[58] Field of Search .............................. 136/251, 291

[56] References Cited

U.S. PATENT DOCUMENTS 5,112,408  5/1992  Melchior ................. 136/251

FOREIGN PATENT DOCUMENTS

| 0 440 103-A2 | 8/1991 | European Pat. Off. | 136/251 |
| 2 286 509-A | 4/1976 | France | 136/251 |
| 28 34 404-A | 2/1980 | Germany | 136/251 |
| 36 11 543-A1 | 10/1987 | Germany | 136/251 |
| 57-162374 | 10/1982 | Japan | 136/251 |
| 3-22572 | 1/1991 | Japan | 136/251 |

OTHER PUBLICATIONS

*Patent Abstracts of Japan*, vol. 15, No. 194, May '91, abstracting JP 3-049 941 of 4 Mar. '91, Okanda et al./ Mitsubishi Electric Corp.

*Primary Examiner*—Nam Nguyen
*Attorney, Agent, or Firm*—Milton Oliver; Ware, Fressola, Van Der Sluys & Adolphson LLP

[57] ABSTRACT

Solar panel with photovoltaic solar cells (4) and a carrier plate (8) located underneath the solar panel surrounded by synthetic resin (1, 3, 5, 7, 9) wherein the carrier plate (8) features numerous openings (25) distributed over the surface for the synthetic resin to penetrate.

2 Claims, 7 Drawing Sheets

SOLAR MODULE WITH PERFORATED PLATE

FIELD OF THE INVENTION

The invention relates to a solar panel with photovoltaic solar cells and a carrier plate located underneath the solar panel, where the solar cells and the carrier plate are surrounded by synthetic resin.

BACKGROUND OF THE INVENTION

It is known to produce solar panels with a glass pane serving as a carrier plate positioned above the solar cells. It is additionally known to employ carrier plates underneath the solar cells. These carrier plates are bonded together using synthetic materials. In general, the selection of the carrier plates is limited to those ensuring a good bond between the plates. In addition, carrier plates made of metal structures have the disadvantage that they are electrically conducting, which may cause insulation problems.

German patent application DE-A-36 11 543 discloses a solar module that features solar cells sealed in a transparent synthetic resin layer. The solar cells sealed in such a manner are adhered to a carrier layer made of corrugated aluminum.

It is additionally known to attach a solar panel to the upper side of a roof tile. It became apparent that oftentimes solar panels do not have sufficient stability and that roof tiles have liberal production tolerances making the fit of the solar panels insufficient; they are either seated too loosely on the roof tile or are too large to fit.

SUMMARY AND OBJECTS OF THE INVENTION

It is the object of this invention to improve the stability, robustness, tightness, and design simplicity of a solar panel of the kind mentioned above.

It is an additional object to improve a roof tile/roof slate such that the solar panel will always have a secure and precise bonding, even with liberal production tolerances and production-related torsion warps of the roof tile/roof slate.

It is furthermore an object to adapt the design of the solar panel to the needs of a wall or roof covering and to improve the design.

This object is attained by the embodiment according to the invention such that the carrier plates feature numerous openings distributed over the surface for the synthetic resin to penetrate, thus producing an unbreakable bond.

The perforated carrier plate combined with the synthetic resin of the solar panel offers an optimal bond ensuring that the solar cells rest securely, tightly, and break-free.

A particular advantage of the carrier plate is that indentations corresponding to the geometry of the solar cells are stamped into the plate where the solar cells are affixed. The result is that the synthetic resin material above the solar cells forms a smooth, planar surface.

Ribbing of the carrier plate offers a particular advantage. It can be done such that the carrier plate becomes significantly more rigid. Additionally, the rib channels improve the ventilation of the carrier plate and accordingly intensify heat removal from the solar cells. The ribs can be designed such that the wiring can be accommodated as well.

To remove the heat quickly from the solar cells and thus improve the efficiency of the solar system, it is advantageous to connect the carrier plate to a highly heat emitting system. The carrier plate may advantageously be produced as a pressed piece/stamping or as an inexpensive mass product using extrusion technology.

It is particularly advantageous that, using these mass production technologies, cable harnesses/cable supports can be joined directly to the carrier plate. Wiring and connecting of the electrical cables is thus simplified and firm. Loosely dangling wires are avoided.

It is particularly advantageous if the carrier plate features on the sides extensions that can engage in recesses of the roof tile/roof slate.

The extensions of the solar panel protruding to the side are flexible due to the flexibility of the carrier plate and can adapt to the roof tile/roof slate even with varying deviations in dimensions. This ensures a secure and strong hold. In this manner, the solar panels will fit into the roof tile/roof slate even when the inside dimensions of the roof tile/roof slate are significantly smaller than intended and the recesses in the roof tile/roof slate are twisted and warped.

It is particularly advantageous if the recesses cover a length that is a fraction of the entire length of the inner edge.

An additional embodiment for attaching the solar panel to the roof tile/roof slate has the insertion slots reaching into the recesses such that the solar panel can be inserted into the recesses without distortion and then attached.

A particularly tight hold of the solar panel on the roof tile/roof slate is achieved if numerous micro containers (microspheres) containing adhesive are attached to the surface of the extensions. These micro containers may contain as one part a first component and as a second part a second component of a two component adhesive.

The roofing element photovoltaic system according to the invention features a number of significant advantages. The roof can initially be covered in a conventional manner. The solar panels can be pressed into the roof tiles at a later date and anchored in a non-slipping manner; the energy supply can be constructed successively, all without the need to uncover or change the roof.

An additional advantageous embodiment is a solar slate panel that can be nailed as a regular wall and roof casing element to the roofs and walls as protection against influences of the weather.

These solar slate panels are made in the same sizes as wall casing elements available on the market and are thus compatible to conventional systems.

The solar cells are positioned such that they are placed in the non-overlapping, open regions of the solar slate panel.

The solar slate panel is particularly advantageous and costefficient since it has a dual function as protection and as casing for energy generation, and does not need a support construction, making the cost only that of a slate panel available on the market, all resulting in a cost-effective solar system.

Also, regular cost-effective photovoltaic modules can be manufactured when using the solar panel technology with a perforated and ribbed carrier plate. The frameless solar modules can be nailed or screwed to the support construction. Since metal frames are not required, the usual corrosion problems are avoided and lightning strikes prevented.

An additional embodiment is the photo-voltaic blind. Advantageously, the carrier plate is produced by continuous extrusion such that it is manufactured with the design-common, curvature featuring indents for the solar cells. Channels for wiring cables are formed in the back side.

BRIEF DESCRIPTION OF THE DRAWINGS

Further details and advantageous refinements of the invention are set forth in the following description and associated drawings of the preferred embodiment, of which

DETAILED DESCRIPTION

Figure 5:
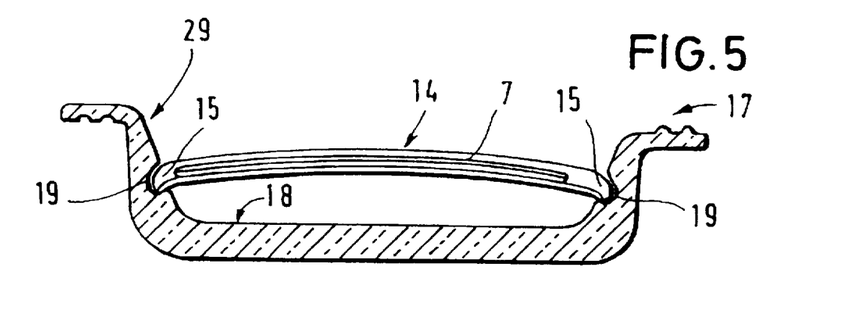
FIG. 5 is a section through the roof tile/roof slate in a first embodiment.
Figure 7:
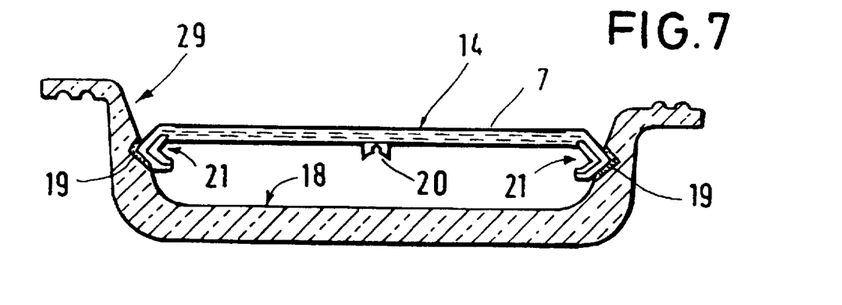
FIG. 7 is a section through a second embodiment.

A roof tile/roof slate, as illustrated in FIGS. 5 and 7, in the following called roof tile 17, is made of clay, ceramic, concrete or a synthetic material and features a recess 18 that is open on the top giving the roof plate a wide U-shaped cross section with its free ends being bent towards the outside to create the traditional interlocking rabbet overlaps.

Figure 4:
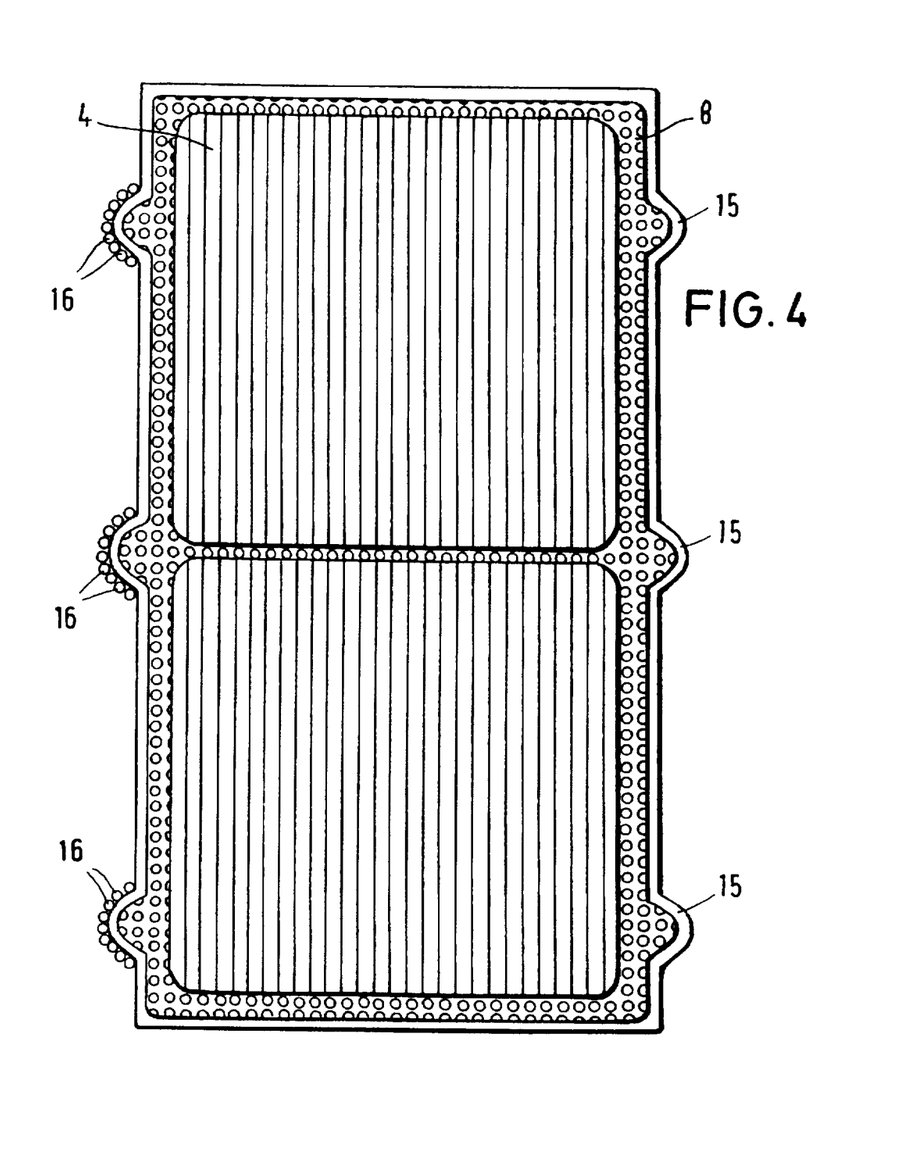
FIG. 4 is a top view of solar panel according to FIG. 5.
Figure 6:
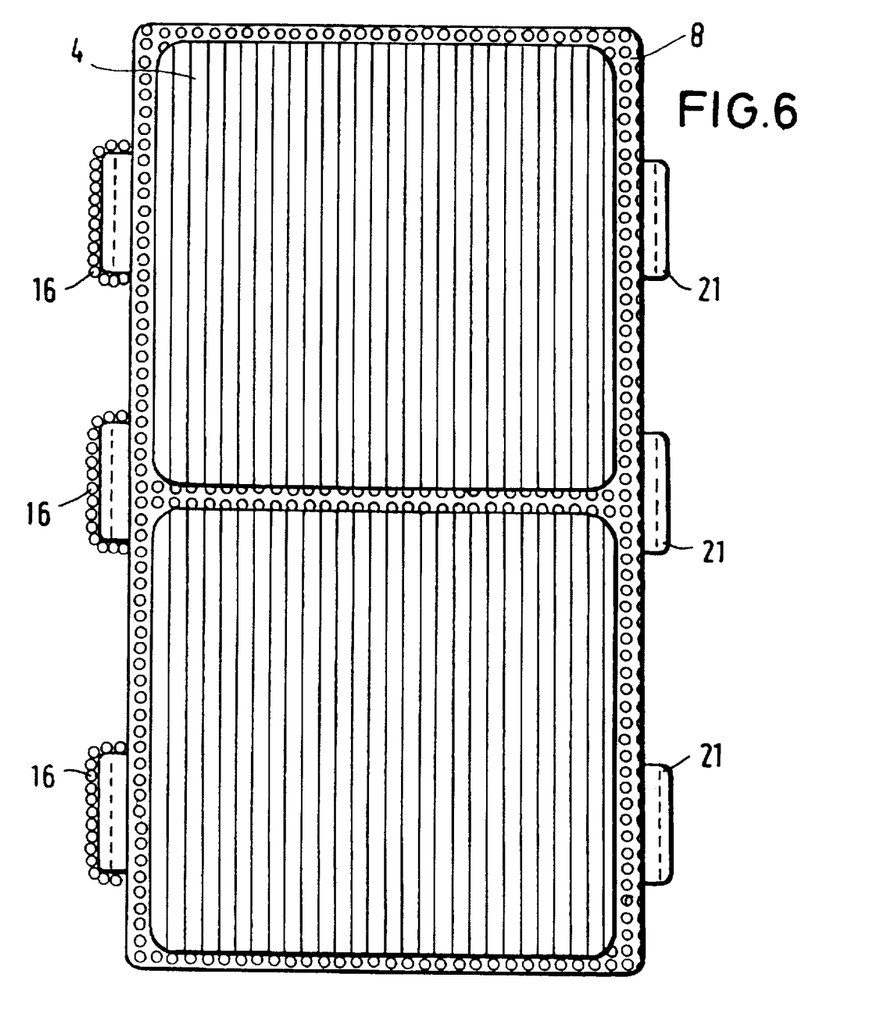
FIG. 6 is a top view of a second embodiment.

Individual recesses 19 are formed in the sides, in the inner edges 25 of the recess 18 with the extensions 15, 21 of the solar panel 14 engaging in these recesses. Thus, the solar panel 14 covers the top side of the recess 18 in its entirety. The solar panel 14 is made with solar cells (photovoltaic elements) 4 that are supported by a carrier plate 8 positioned underneath the solar cells, as illustrated in FIGS. 4 and C.

Extensions 15, 21 are joined to the carrier plate 8 and positioned along the two longitudinal sides on the solar panel 14. The extensions 15, 21 do not cover the entire length of the side edge of the carrier plate 8, rather each side of the carrier plate has two or more individual extensions 15 that engage formfittingly in correspondingly shaped individual recesses 19 of the inner edges or inner side walls of the roof tile 17.

Figures 8, 9:
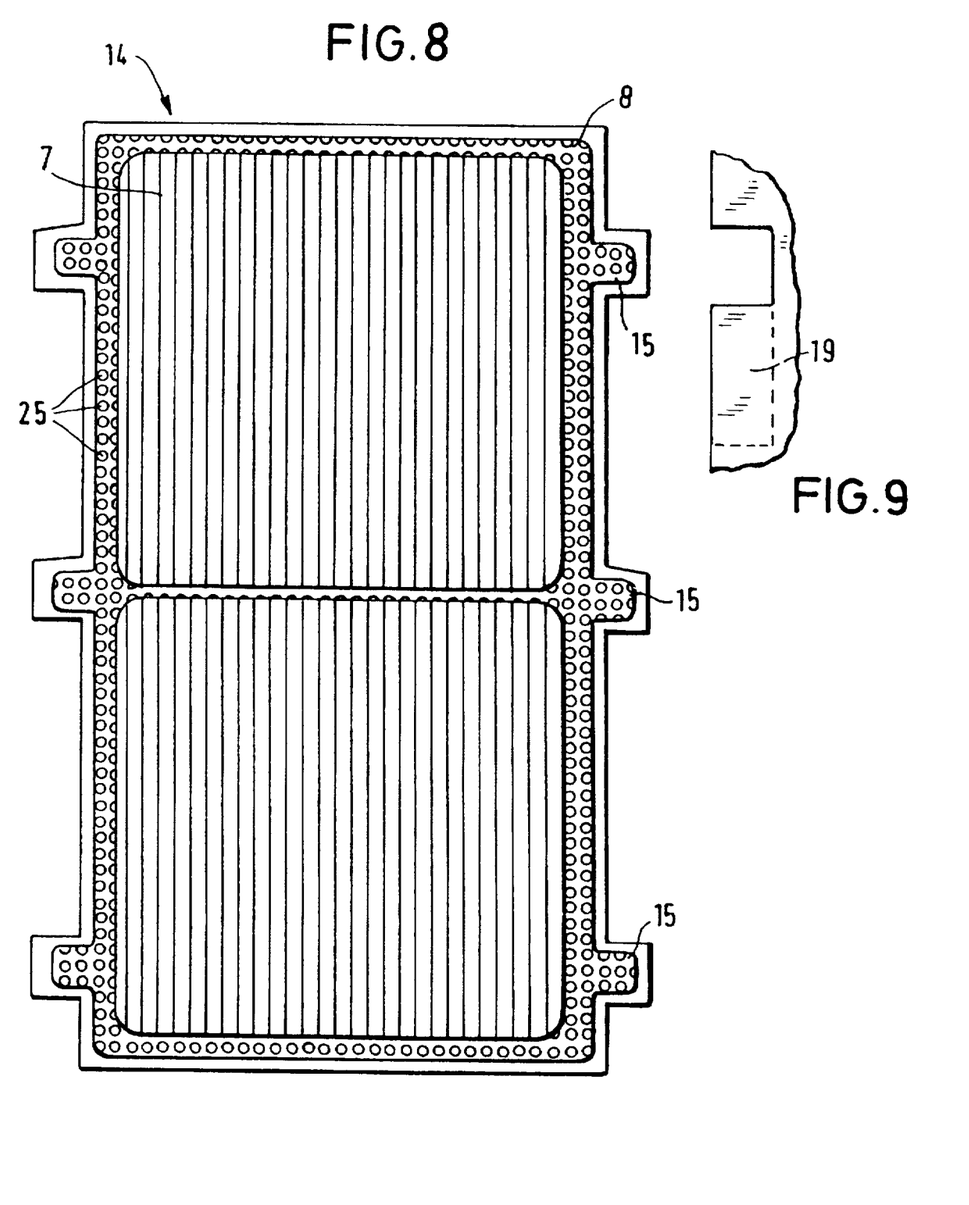
FIG. 8 is a top view of a third embodiment.
FIG. 9 is a sketch of a bayonet closure.

In this manner, the recesses 19, as illustrated in FIG. 9, have a length that is only a fraction of the entire length of the inner edge. These recesses 19 may be groove sections, longitudinal holes, pockets, and/or bore holes.

The special design of the extensions 15 and the flexibility of the solar panel and the carrier plate creates a spring/clamp effect to secure the solar panel 14 to the roof tile. In one embodiment, the extensions engage in longitudinal recesses similar to bayonet-type connections on the support structure, particularly of a roof tile/roof slate.

Protruding downwards, a cable support 20 (See FIG. 7) is joined to the carrier plate 8 and the bottom synthetic resin layer 9 (See FIGS. 1 and 3) at the bottom side of the solar panel 14. One cable support each is located on the bottom narrow side and on the top narrow side of the solar pane 14.

Figure 1:
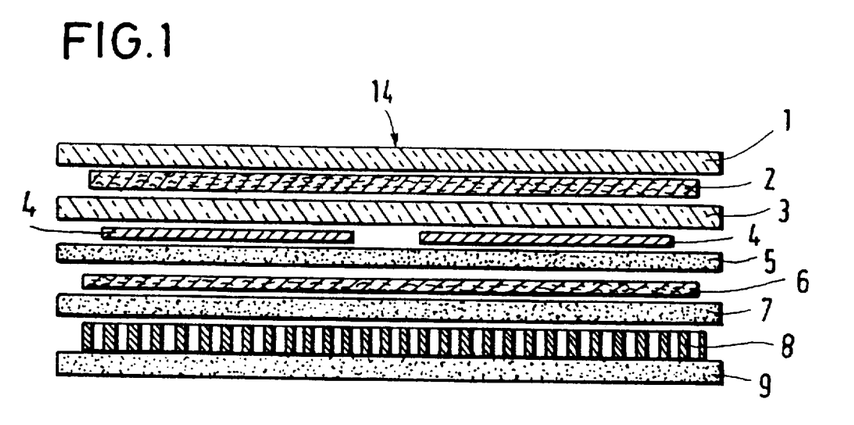
FIG. 1 is a section through the structure of a solar panel.
Figure 2:
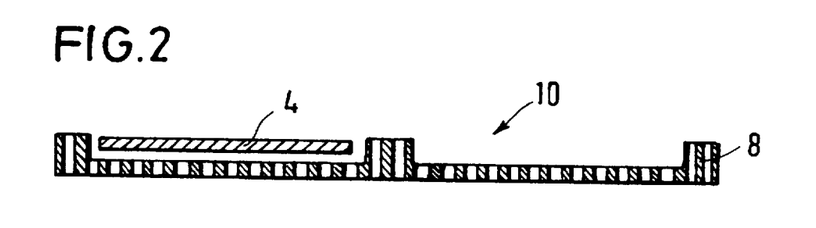
FIG. 2 is a section through the carrier plate.
Figure 3:
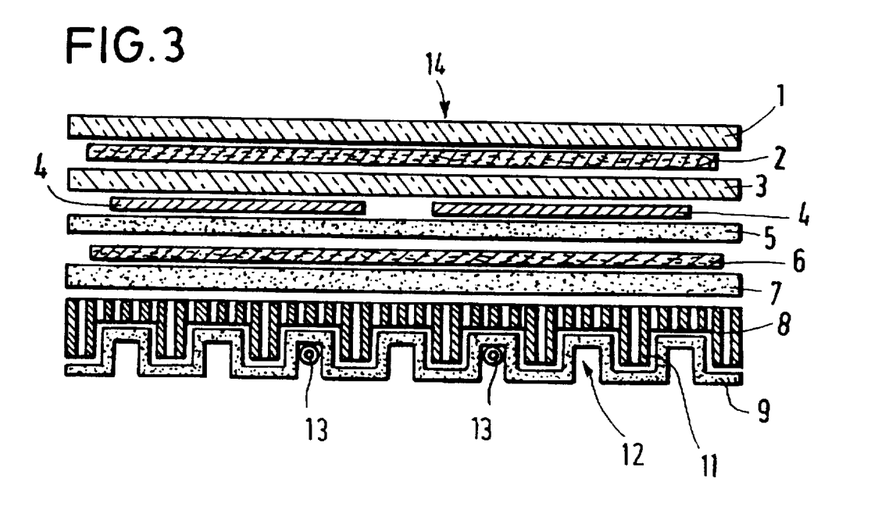
FIG. 3 is a section through the solar panel with ribbing.

The carrier plate 8 constructed as a perforated plate is made of synthetic resin material, particularly reinforced with glass fiber or metal, and features numerous circular openings 25 (See e.g. FIG. 8) arranged at equal distances from one another. A thermo adhesive synthetic resin 9 penetrates the openings 25 and adheres to both sides of the carrier plate. For this purpose, the solar panel as shown in FIGS. 1, 2, 3 has the following design features:

As a top layer 1, a transparent and highly light-transmissive synthetic polymer resin (particularly acrylic or PTFE), underneath this layer, a glass fiber matrix or web 2 with an adjusted refractive index, thereunder a layer 3 made of a highly transparent synthetic material similar to layer 1, thereunder solar cells 4 which may be surrounded by a transparent thermo adhesive, thereunder an inner thermo-adhesive layer 5, which may be transparent or colored, thereunder a spacing support 6, which may be eliminated if the carrier plate is made of a non-conducting material, e.g., GFK (German acronym for GlasFaserKunststoff=glass fiber plastic, i.e. fiberglass), thereunder an additional inner thermo-adhesive layer 7 (not required if there is no layer 6)

thereunder a flexible carrier plate 8, which may be colored, thereunder a bottom transparent or colored thermo adhesive layer 9.

The two thermo-adhesive layers 7, 9 are connected through the openings 25 of carrier plate a, thus creating a strong bond. The entire solar panel, thus, forms a laminated board of high strength and durability with the solar cells completely sealed therein.

The carrier plate 8 made of synthetic or metal material includes the side extensions 15 that engage in the recesses 19 of a roof tile or roof slate.

These extensions is on the side are themselves encased in the synthetic resin material as well.

When installing the solar panel, it can be bent slightly by hand, which shortens the wide side, allowing the extensions 15 to easily reach into, and engage the recesses 19.

In the embodiment according to FIG. 3, the carrier plate 8 features ribs 11 that form channels 12 on the bottom side where electrical cables can be installed.

Figure 12:
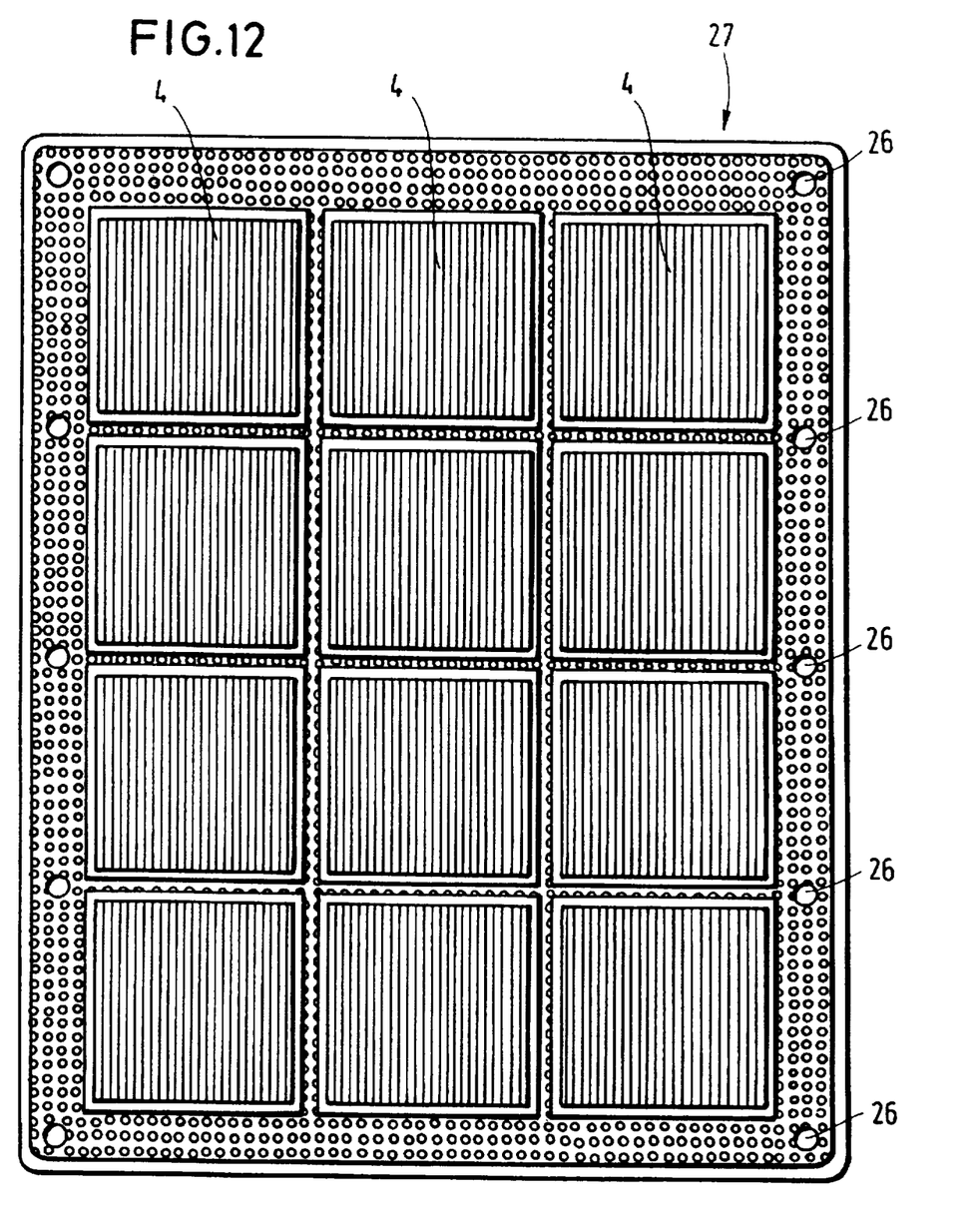
FIG. 12 is a top view of an additional embodiment (slate encasing panel)
Figure 13:
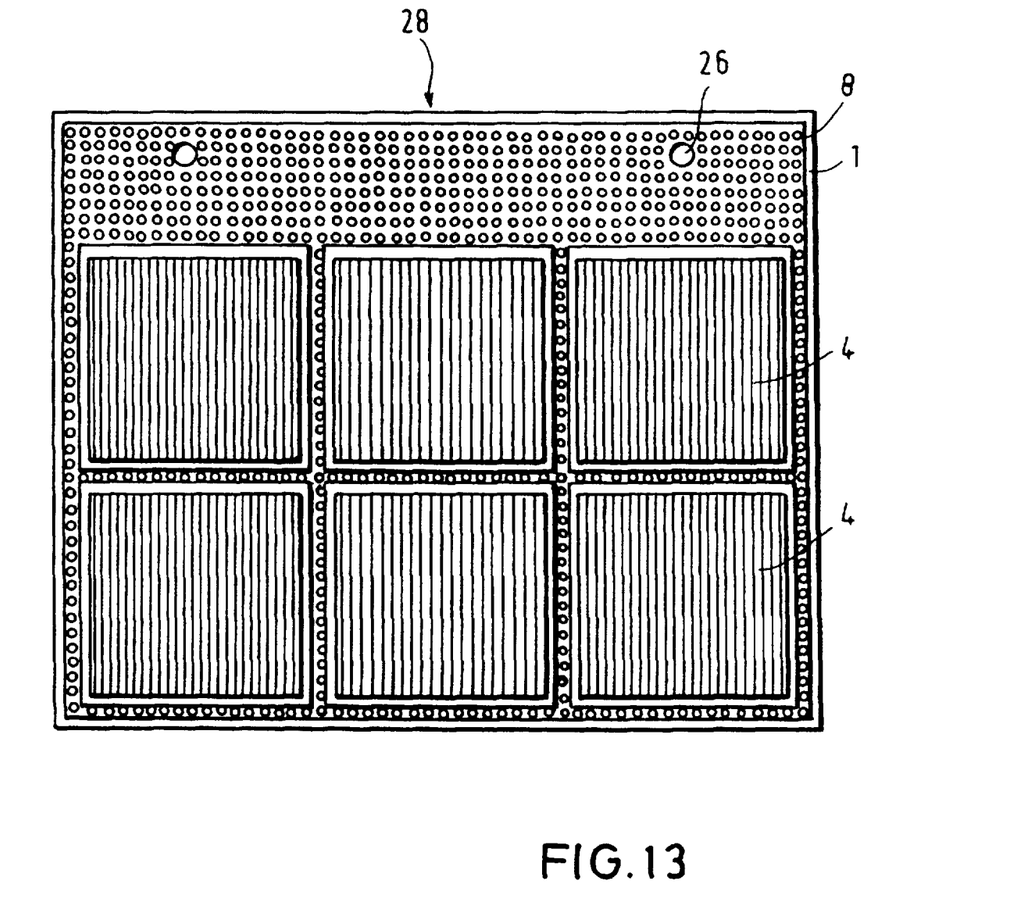
FIG. 13 is a top view of yet another additional embodiment.

Shown in FIGS. 12–13 are embodiments 27, 28 of the solar panel as a common photovoltaic module or slate panel, wherein holes 26 are positioned at the outer rims to attach the solar panel to support structures, particularly without nails or screws.

Figure 10:
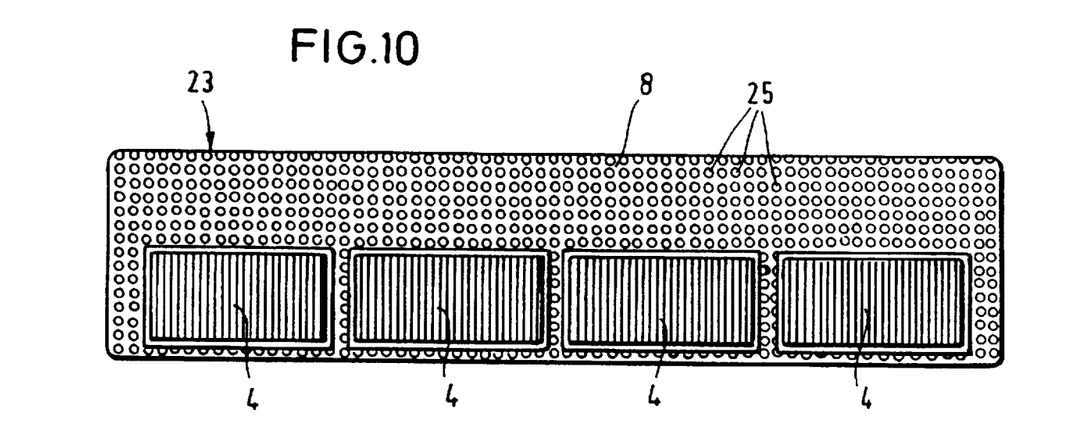
FIG. 10 is a top view of a solar blind slat.
Figure 11:
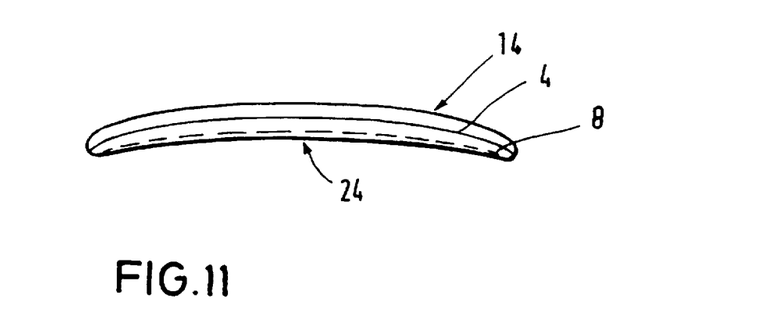
FIG. 11 is a cross-sectional view of the solar blind slat.

The solar panel may, as illustrated in FIGS. 10–11, be designed as a blind slat 23 with solar cells 4 where the required curvature of the solar panel as a blind slat, as illustrated by FIG. 11, can be set through the extrusion tool.

I claim:

1. A solar panel comprising a plurality of photovoltaic solar cells (4);

a carrier plate (8) supporting said solar cells; and synthetic polymer resin (1, 3, 5, 7, 9) surrounding said cells on said carrier plate, wherein the carrier plate (8) is formed with a plurality of openings (25) distributed over its surface and said synthetic polymer resin penetrates said openings.

2. A roof tile/roof slate (1) of a material selected from the group consisting of clay, ceramic, concrete and synthetic polymer resin in combination with a solar panel (6) according to claim 1, wherein the solar panel is a polygon having two or more individual extensions (15) per side and located on two opposite sides, said extensions engaging form-fittingly in correspondingly shaped individual recesses (19) of inner edges (18) of the roof tile/roof slate, where the recesses (19) are each located at a side edge of the roof tile/roof slate.

* * * * *

UNITED STATES PATENT AND TRADEMARK OFFICE
CERTIFICATE OF CORRECTION

PATENT NO. : 5,776,262
DATED : Jul. 7, 1998
INVENTOR(S) : Melchior

It is certified that error appears in the above-identified patent and that said Letters Patent is hereby corrected as shown below:

```
In column 1, line 64 "," after "quickly" should be deleted.
In column 2, line 47 "costefficient" should be --cost-efficient--.
In column 2, line 61 "." after "common" should be deleted.
In column 3, line 32 "C" should be --6--.
In column 3, line 38 "formfittingly" should be --form-fittingly--.
In column 4, line 17 "." after "flexible" should be deleted.
In column 4, line 21 "a" should be --8--.
In column 4, line 28 "is" should be --15--.
In column 4, line 38 after "to", "-" should be deleted.
```

Signed and Sealed this

Twenty-seventh Day of April, 1999

Attest:

Attesting Officer

Q. TODD DICKINSON

Acting Commissioner of Patents and Trademarks